US008508316B2

(12) United States Patent
Link

(10) Patent No.: US 8,508,316 B2
(45) Date of Patent: Aug. 13, 2013

(54) BULK ACOUSTIC WAVE FILTER OF LADDER-TYPE STRUCTURE

(75) Inventor: Andreas Link, Munich (DE)

(73) Assignee: Epcos AG, Munich (DE)

( * ) Notice: Subject to any disclaimer, the term of this patent is extended or adjusted under 35 U.S.C. 154(b) by 379 days.

(21) Appl. No.: 12/909,200

(22) Filed: Oct. 21, 2010

(65) Prior Publication Data
US 2012/0098624 A1    Apr. 26, 2012

(51) Int. Cl.
H03H 9/54 (2006.01)
(52) U.S. Cl.
USPC .......................................... 333/189; 333/187
(58) Field of Classification Search
USPC .......................................... 333/189–196, 133
See application file for complete search history.

(56) References Cited

U.S. PATENT DOCUMENTS

| 5,561,406 | A  | * | 10/1996 | Ikata et al. ..................... | 333/126 |
| 5,939,957 | A  | * | 8/1999  | Iwata ............................ | 333/189 |
| 6,351,197 | B1 | * | 2/2002  | Selmeier et al. .............. | 333/195 |
| 7,145,417 | B2 | * | 12/2006 | Kimachi et al. ............... | 333/189 |
| 7,365,619 | B2 | * | 4/2008  | Aigner et al. .................. | 333/189 |
| 2004/0263286 | A1 | * | 12/2004 | Unterberger ................... | 333/187 |
| 2008/0100397 | A1 | * | 5/2008  | Nam et al. ..................... | 333/133 |
| 2010/0110940 | A1 | * | 5/2010  | Hara et al. ..................... | 370/277 |
| 2010/0188166 | A1 | * | 7/2010  | Hara et al. ..................... | 333/133 |

FOREIGN PATENT DOCUMENTS

| JP | 11-46126    | * | 2/1999  |
| JP | 11-312951   | * | 11/1999 |
| JP | 2002-300003 | * | 10/2002 |

* cited by examiner

Primary Examiner — Barbara Summons
(74) Attorney, Agent, or Firm — Slater & Matsil, L.L.P.

(57) ABSTRACT

A bulk acoustic wave filter of a ladder-type structure includes a series arm and at least a series arm resonator which is disposed in the series arm, such that the series arm is distributed in series arm sections between an input terminal and an output terminal. The bulk acoustic wave filter further includes a first parallel arm that includes a parallel arm resonator and an inductivity connected in series between the series arm and a reference terminal, and at least a second parallel arm that includes a parallel arm resonator. The first parallel arm and the at least one second parallel arm are connected in parallel between a common one of the series arm sections and the reference terminal.

15 Claims, 8 Drawing Sheets

BULK ACOUSTIC WAVE FILTER OF LADDER-TYPE STRUCTURE

TECHNICAL FIELD

The present invention relates to a BAW (Bulk Acoustic Wave) filter comprising a plurality of BAW resonators disposed on a supporting substrate. In particular embodiments, the present invention relates to a BAW filter in which a plurality of BAW resonators define a ladder-type filter circuit.

BACKGROUND

Actual and prospective communication systems make high demands on components used in its transceiver/receiver circuits. The reason for the high requirements is that, on the one hand, new systems are developed more effectively and, on the other hand, more and more frequency ranges for new bands of mobile communications are allocated in a frequency range of 500 MHZ to 6 GHZ, which is applicable for mobile communication systems. Since mobile communication systems, such as mobile phones, have to be operated around the world in different frequency bands high demands are made in relation to the edges of band-pass filters provided in the mobile phones due to the reduction of distances between neighboring bands. Furthermore, a high suppression of a stop band of a band-pass filter is necessary concurrently with a small insertion loss of the filter. In terms of duplexers and generic multiplexers high suppression of the stop band of a filter in the frequency range of a neighboring filter is required.

A compromise has to be found between the suppression in the stop band and the insertion loss in the pass band of a filter of a destined technology. In a BAW based filter technology, serial arm BAW resonators and parallel arm BAW resonators are disposed on a substrate so as to define a ladder-type filter circuit which has a serial arm having input and output terminals and a plurality of parallel arms located between the serial arm and a reference potential. A BAW resonator comprises a piezoelectric layer which is disposed between a top electrode and a bottom electrode, the stack of layers is disposed on a supporting substrate such as a wafer of silicium.

In the FBAR (film bulk acoustic resonator) technology an air gap is provided on top and bottom of the stack so that an acoustic bulk wave is reflected at the boundary between the top and bottom electrode of the stack and the air gap. In another technology, the so-called BAW-SMR (bulk acoustic wave-solidly mounted resonator) technology, the stack of electrode-piezoelectric layer-electrode is supported by a sequence of further thin films with alternating low and high acoustic impedance. These alternating layers are effective as an acoustic reflector and uncouple the resonator acoustically from the supporting substrate.

In general, a high suppression in the stop band of a ladder-type filter result in a low, i.e., bad, insertion loss of the filter. Thus, the suppression in the stop band of a filter is increased only in a destined local frequency range, rather than reducing the level of the stop band over a wide frequency range.

A possibility to generate a local pole in the transmission curve S21 of a filter is to couple the resonators in the parallel arms of the ladder-type structure of a filter to a reference potential by inductivities that are connected in series with the parallel arm resonators. Another possibility to generate local poles in the filter transmission curve S21 which is often used in antenna duplexers is to provide phase inversion circuits in the duplexer so that a mutual influence of the receiver and transmitter filter of the antenna duplexer can be avoided. Another approach uses inductivity/capacity-networks comprising inductivities and capacities which provide a short circuit or an open circuit effective for destined local frequency ranges.

If multiple pairs of poles are required to realize a destined filter curve in the stop band, more than one parallel arm resonator has to be connected to the reference potential via a comparatively high inductivity. In consequence, the steepness of the left edge of the pass band diminishes and the suppression directly below the pass band is increased. A possibility to overcome this effect is to introduce additional ladder-type stages so that more parallel arm resonators are provided which have to be connected in series with inductivities to the reference potential. However, this kind of embodiment is applicable in a practical design for up to only four ladder-type stages since the required area for additional components increases and also because the insertion loss is raised, which has a negative effect in relation to the pass band of the filter.

Accordingly, there has been a demand for a bulk acoustic wave filter capable of increasing the suppression in a local frequency region near the pass band without significantly increasing the insertion loss.

SUMMARY OF THE INVENTION

The present invention is directed to a bulk acoustic wave filter which significantly increases an attenuation amount in a frequency region of a stop band of a filter without significantly increasing the insertion loss.

According to a preferred embodiment of the present invention a bulk acoustic wave filter of a ladder-type structure comprises an input terminal to couple an input signal into the filter, an output terminal to couple an output signal out of the filter, and a reference terminal to apply a reference potential. The bulk acoustic wave filter further comprises a series arm having the input terminal and the output terminal, at least a series arm resonator being disposed in the series arm, such that the series arm is distributed in series arm sections between the input terminal and the output terminal by the at least one series arm resonator. The bulk acoustic wave filter further comprises a first parallel arm comprising a parallel arm resonator and an inductivity being connected in series between the series arm and the reference terminal, and at least a second parallel arm comprising a parallel arm resonator. The first parallel arm and the at least one second parallel arm are connected in parallel between a common one of the series arm sections and the reference terminal.

According to the embodiment of the bulk acoustic wave filter, at least one parallel arm resonator in the ladder chain of the ladder-type structure is split into at least two discrete parallel resonators. The parallel resonators may share the same node in the series arm of the ladder-type filter, and are individually connected to the reference potential. The reference potential is usually a ground potential.

In contrast to the embodiment of a ladder-type BAW filter comprising only one parallel arm path with one parallel arm resonator coupled to the reference potential by an inductive element the transmission curve S21 of an acoustic wave filter according to the present invention has not only one pair of poles per ladder-type stage but rather altogether two pairs of poles, i.e., four poles, for the split parallel arms. That means the filter transmission curve S21 shows at least one additional independent pair of poles in the stop band of the filter without increasing the number of stages of the ladder-type filter. Furthermore, the number of the series arm resonators remain constant.

The consumption of area just slightly increases for the new filter concept. In particular, the additional space is required due to the necessary distance between the split parallel arms comprising the first parallel arm resonator and the at least one second parallel arm resonator. A bump contact to couple the at least one second parallel arm resonator to the series arm is also necessary in the concept of a ladder-type structure which generates an additional pair of poles by providing an additional second parallel arm with a shunt resonator. The area of the first parallel arm resonator and the area of the at least one second parallel arm resonator is the same as the area of only one parallel arm resonator used in the conventional design if the characteristic filter curve of the pass band is the same for the new filter design and the conventional filter design.

BRIEF DESCRIPTION OF THE DRAWINGS

Several embodiments of a bulk acoustic wave filter are shown in the following figures for better understanding of the new bulk acoustic wave filter concept.

The following list of reference symbols can be used in conjunction with the drawings.

| S | series arm resonator |
|---|---|
| P | parallel arm resonator |
| I | input terminal |
| O | output terminal |
| SA | series arm |
| PA | parallel arm |
| L | inductivity |
| Z | passive network |
| R | reference terminal |
| G | ground potential |
| A | series arm section |
| CP | connection point (bump contact) |
| S21 | transfer function of transmission parameter S21 |

DETAILED DESCRIPTION OF ILLUSTRATIVE EMBODIMENTS

Figure 1A:
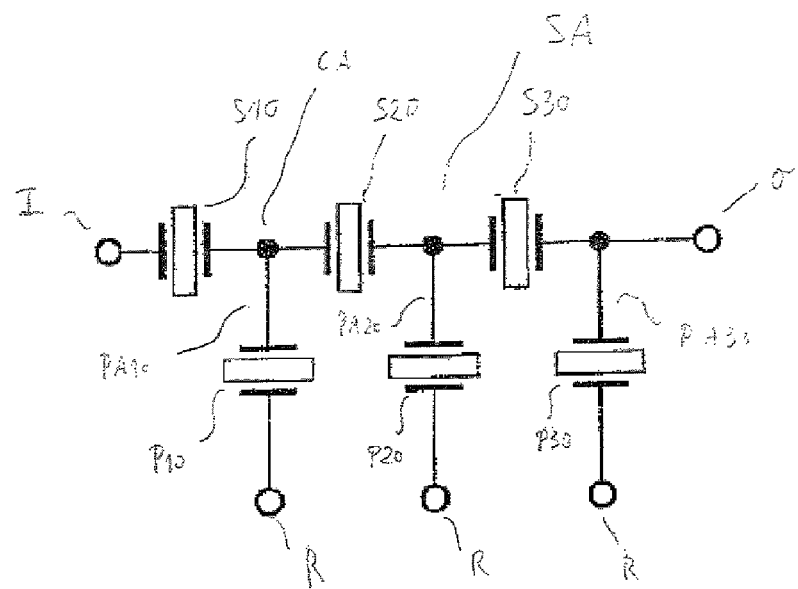
FIG. 1A shows an embodiment of a bulk acoustic wave filter of a ladder-type structure having three stages.

FIG. 1A shows an embodiment of a bulk acoustic wave filter of a ladder-type structure. The ladder-type filter is formed of a series arm SA having an input terminal I to couple an input signal into the filter and an output terminal O to couple an output signal out of the filter. The series arm comprises a plurality of series arm resonators S10, S20, S30 coupled in series in the series arm between the input terminal I and the output terminal O. Furthermore, the BAW filter comprises parallel arms PA10, PA20, PA30. The series arm SA is distributed into several series arm sections CA between the input and output terminal. Each of the parallel arms PA10, P20 and P30 is connected to one of the series arm sections CA and a reference terminal R to apply a reference potential, such as a ground potential.

The embodiment of a bulk acoustic wave filter of FIG. 1A shows a ladder-type structure having three stages wherein each stage of the BAW filter of FIG. 1A comprises a serial arm resonator and a parallel arm resonator. A first stage comprises the series arm resonator S10 and the parallel arm resonator P10, a second stage comprises series arm resonator S20 and parallel arm resonator P20, and a third stage comprises a series arm resonator S30 and parallel arm resonator P30.

Figure 1B:
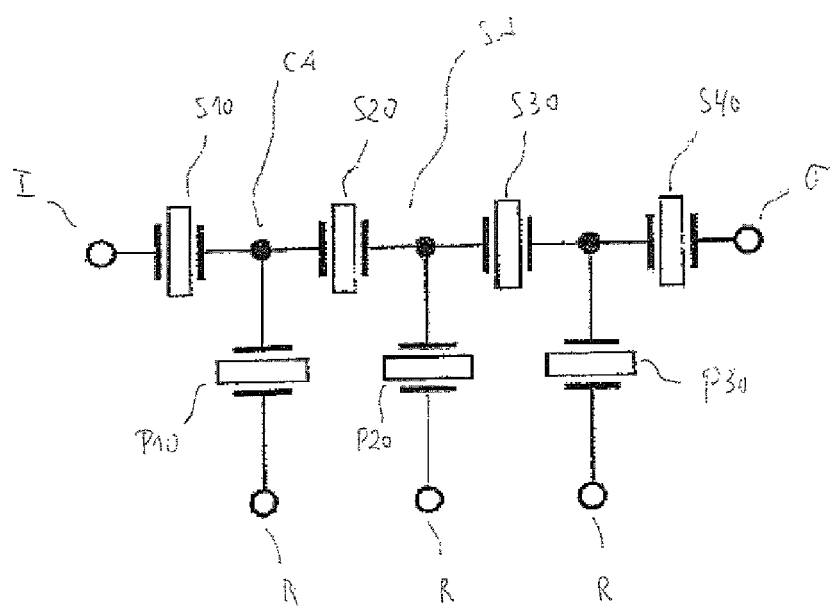
FIG. 1B shows a bulk acoustic wave filter of a layer-type structure having 3.5 stages.

FIG. 1B shows an embodiment of a BAW filter of a ladder-type structure comprising a series arm SA having a plurality of series arm resonators S10, S20, S30, S40 disposed in series between an input terminal I to apply an input signal and an output terminal O to couple an output signal out of the filter structure. Parallel arm resonators P10, P20 and P30 are connected between the series arm SA of the filter and a terminal R to apply a reference potential. The BAW filter shown in FIG. 1B has 3.5 stages. A first stage comprises series arm resonator S10 and parallel arm resonator P10, a second stage comprises series arm resonator S20 and parallel arm resonator P20, and a third stage comprises series arm resonator S30 and parallel arm resonator P30. Series arm resonator S40 is directly coupled to the output terminal O without having a further parallel arm resonator.

Figure 1C:
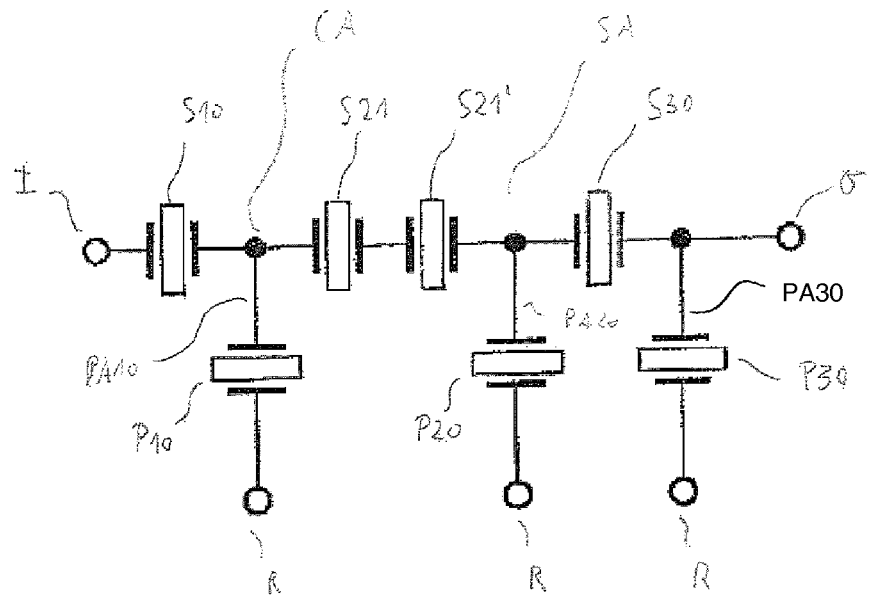
FIG. 1C shows a bulk acoustic wave filter of a ladder-type structure having serially split resonators in the series arm.

FIG. 1C shows another embodiment of a BAW filter comprising a series arm SA having the input terminal I to couple an input signal into the filter and the output terminal O to couple an output signal out of the filter. Series arm SA comprises series arm resonators S10, S21, S21' and S30 coupled in series between the input terminal I and the output terminal O of the series arm. In addition the ladder-type structure of the BAW filter has parallel arms PA10, having a parallel arm resonator P10 coupled between the series arm and a reference terminal R, a parallel arm PA20 comprising parallel arm resonator P20 coupled between the series arm and a reference terminal R and parallel arm PA30 comprising parallel arm resonator P30 coupled between the series arm and the reference terminal R.

In comparison to the embodiment of a ladder-type filter shown in FIG. 1A series arm resonator S20 is split in series arm resonators S21 and S21' coupled in series in one of the series arm sections between parallel arm PA10 and parallel arm PA20.

Figure 1D:
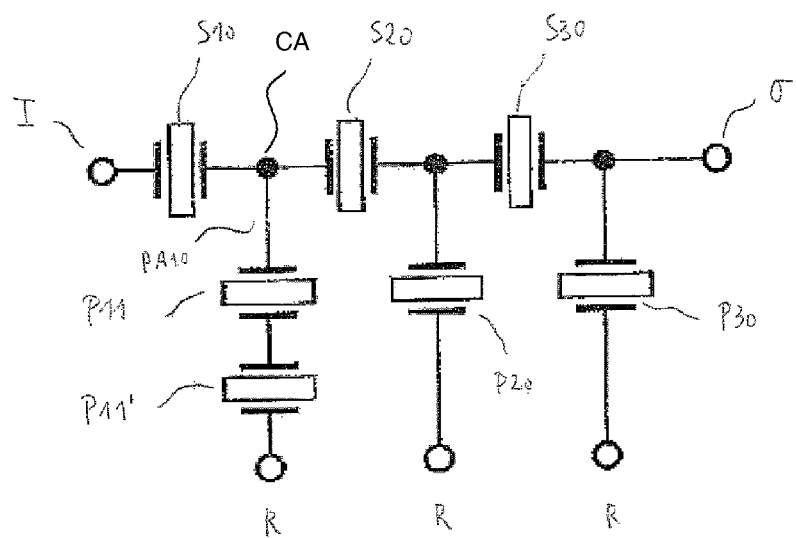
FIG. 1D shows an embodiment of a bulk acoustic wave filter in a ladder-type structure having serially split resonators in the parallel arm.

FIG. 1D shows a further embodiment of a BAW filter similar to the embodiment shown in FIG. 1A. The embodiment of FIG. 1D distinguishes from the embodiment shown in FIG. 1A in that parallel arm resonator P10 of parallel arm PA10 is split in series arm resonators P11, P11' which are coupled in series between reference terminal R to apply the reference potential and a series arm section CA located between series arm resonators S10 and S20.

As shown in the embodiments of the BAW filters of the ladder-type structure of FIGS. 1A to 1D each stage of a ladder-type filter comprises a series arm resonator and a parallel arm resonator. The ladder-type structure is arranged such that the input or output terminal is connected either firstly to a series arm resonator or firstly to a parallel arm resonator.

Figure 2:
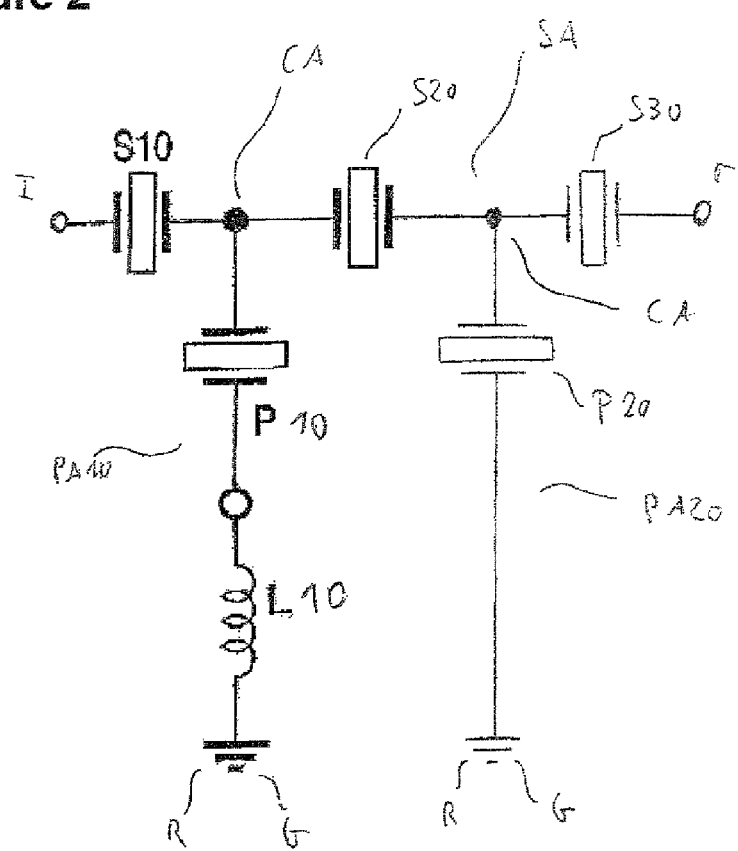
FIG. 2 shows an embodiment of a bulk acoustic wave filter having a parallel arm resonator coupled in series with an inductivity.

FIG. 2 shows an embodiment of a BAW filter of ladder-type structure comprising a series arm SA having the input terminal I and the output terminal O and comprising series arm resonators S10, S20 and S30 coupled in series to each other in the series arm. A parallel arm PA10 is coupled to the series arm SA at the arm section CA located between series arm resonator S10 and S20 and is further coupled to a terminal R to apply a reference potential such as a ground potential. A further parallel arm PA20 comprising a parallel arm resonator P20 is connected at an adjacent series arm section CA located between series arm resonators S10 and S30 and is further connected to the reference terminal R. The parallel arm PA10 comprises the parallel arm resonator P10 and the inductivity L10 which are coupled in series between series arm section located between series arm resonators S10 and S20 and the reference terminal G.

Figure 3:
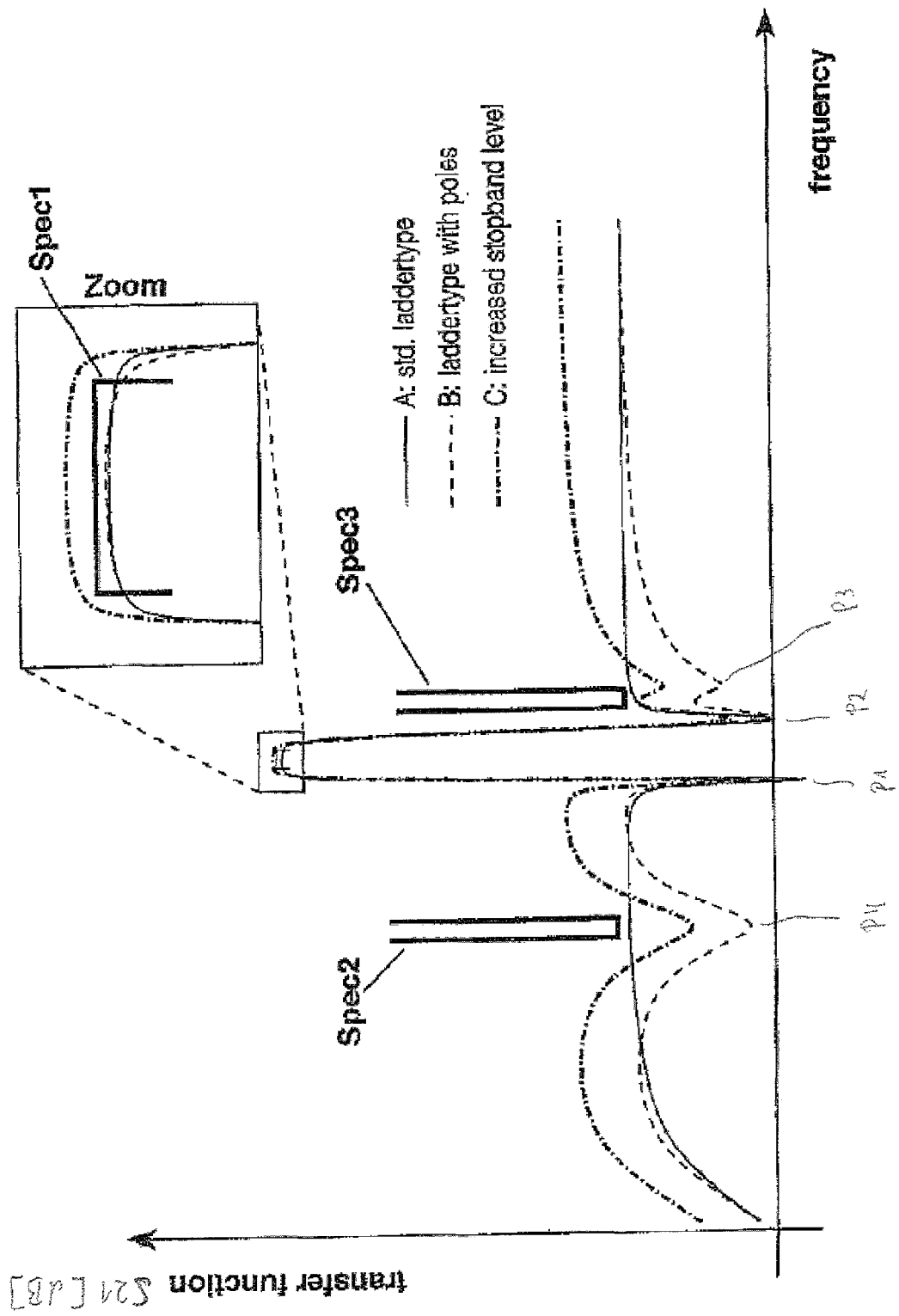
FIG. 3 shows a transfer function of transmission parameter S21 of a bulk acoustic wave filter.

FIG. 3 shows a transfer function, i.e. the curve of the transmission parameter S21, for different frequency values. The ladder-type structure comprising the series arm resonators in the series arm and the parallel arm resonators in the parallel arms directly connected to the reference terminal causes the development of two acoustic poles indicated as P1 and P2 in the transfer function S21. The filter curve of this simple ladder-type structure is indicated as curve A in the transfer function.

The serial connection of the parallel arm resonator P11 and the inductivity L11 has the effect that a third pole P3 is generated in the stop band above the pass band and a fourth pole P4 is generated in the stop band below the pass band. The frequency $f_{r,high}$ of the third pole P3 is dependent on the inductivity L11 and a static capacitance $C_S$ of the resonator P11. In particular the frequency $f_{r,high}$ may be specified as $$f_{r,high} = \frac{1}{2\pi\sqrt{L11 \cdot C_S}}.$$

The fourth pole P4 is generated at the frequency $f_{r,low}$ which is dependent on the dynamic inductivity LD and the dynamic capacity CD of the parallel arm resonator P11 and the inductivity L11. The frequency $f_{r,low}$ results in $$f_{r,low} = \frac{1}{2\pi\sqrt{(L_D + L11) * C_D}}.$$

The curves indicated with B and C in FIG. 3 show the course of the transmission parameter S21 of a BAW filter of a ladder-type structure having an inductivity connected in series with a parallel arm resonator in a parallel arm. The course C has an increased stop band level in comparison to the course B of the transmission parameter S21, since an area of the parallel arm resonator which is connected in series to the inductivity is adapted so that the specifications SPEC2 and SPEC3 are fulfilled, and in addition SPEC1 in the pass band is also fulfilled.

The series connection of a parallel arm resonator and an inductivity results in the generation of two poles, i.e., a pair of poles which has one pole below the pass band and the other pole located above the pass band. In order to create further pairs of poles other parallel arms of the filter structure may also comprise a parallel arm resonator which is connected in series to an inductivity between the series arm and the reference terminal to apply a ground potential.

Figure 4A:
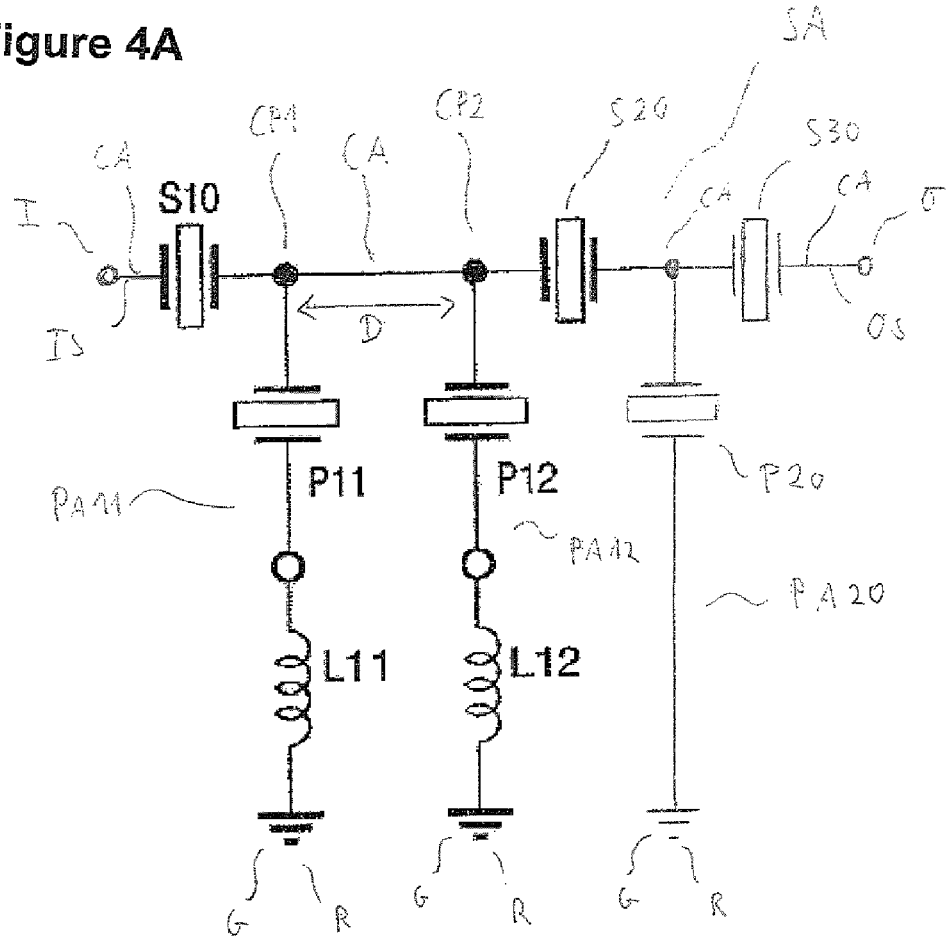
FIG. 4A shows an embodiment of a bulk acoustic wave filter having split parallel arm resonators coupled in series with inductivities.

FIG. 4A shows an embodiment of a BAW filter in a ladder-type structure comprising a series arm SA having an input terminal I to couple an input signal IS into the filter at its one end and an output terminal O to couple an output signal OS out of the filter at its other end. The series arm comprises series arm resonators S10, S20 and S30 which are coupled in series along the series arm between the input terminal I and the output terminal O. The series arm SA is distributed in several series arm sections CA by the series arm resonators. Furthermore, the ladder-type structure comprises parallel arms PA11, PA12 and PA20. The parallel arm PA20 is connected to the series arm at a series arm section CA between series arm resonators S20 and S30, and is further connected to a reference terminal R to apply a reference potential such as the ground potential G.

In contrast to the embodiment shown in FIG. 2 the parallel arm PA10 is split in the parallel arms PA11 and PA12. In addition, the parallel arm resonator P10 of FIG. 2 is split in the parallel arm resonators P11 and P12. Each of the split parallel arm resonators P11 and P12 is individually coupled to the reference terminal G via an inductivity. Parallel arm PA11 is coupled at a connection point CP1 in the series arm section CA between series arm resonators S10 and S20 to series arm SA and is connected to the reference terminal G. Parallel arm PA11 comprises the series connection of parallel arm resonator P11 and inductivity L11. Parallel arm PA12 is connected to series arm SA at a connection point CP2 of the series arm section CA between the series arm resonators S10, S20 and is further connected to the reference terminal G. Parallel arm PA12 comprises parallel arm resonator P12 which is connected in series with inductivity L12 between connection point CP2 and the reference terminal G. The connection points CP1 and CP2 may be configured as bump contacts.

According to the embodiment of the BAW filter shown in FIG. 4A the parallel arms PA11 and PA12 share a common node CP1, CP2 of the same series arm section. The connection points CP1, CP2 are disposed at a distance D to each other but have the same electrical potential. The parallel arm resonators P11 and P12 may be designed such that the sum of the area of both resonators is the same as the area of the parallel arm resonator P10 shown in FIG. 2 which is split now in the two resonators P11 and P12. Both of the parallel arm resonators P11 and P12 may have the same size or different size.

In contrast to the embodiment shown in FIG. 2 the transmission parameter S21 of the embodiment shown in FIG. 4A does not have only one pair of poles per stage of the ladder-type filter, but have altogether two pairs of poles, i.e. four poles. The parallel arm PA11 comprising the series connection of parallel arm resonator P11 and inductivity L11 has a pair of poles P3 at a frequency $f^{P11}_{r,high}$ and P4 at a frequency $f^{P11}_{r,low}$ with $$f^{P11}_{r,high} f_{r,high} = \frac{1}{2\pi\sqrt{L11 \cdot C^{P11}_S}}$$

and $$f^{P11}_{r,low} = \frac{1}{2\pi\sqrt{(L^{P11}_D + L11) \cdot C^{P11}_D}}$$

The parallel arm PA12 comprising parallel arm resonator P12 and inductivity L12 connected in series between series arm SA and reference terminal G generate the pair of poles P5 at a frequency $f^{P12}_{r,high}$ and P6 at frequency $f^{P12}_{r,low}$ with $$f^{P12}_{r,high} = \frac{1}{2\pi\sqrt{L12 \cdot C_S^{P12}}}$$

and $$f^{P12}_{r,low} = \frac{1}{2\pi\sqrt{(L_D^{P12} + L12) \cdot C_D^{P12}}}.$$

In the formula given above $L_D$ specifies the dynamic inductivity, $C_D$ specifies the dynamic capacity and $C_S$ specifies the static capacity of the parallel arm resonators P11 and P12.

The new design of a ladder-type filter enables to generate an additional independent pair of poles in the stop band of the filter without the need to increase the number of stages of the ladder-type filter. At the same time, the number of the series arm resonators remain constant. Furthermore, the area required just slightly increases due to the distance D between the split parallel arm resonators P11 and P12 which have altogether the same area as the original non-split resonator P10, if the form of the pass band remain the same. It is further remarked that the bump contact CP2 to connect the second parallel arm resonator P12 is also required in a ladder-type filter design using an additional stage of the ladder-type filter.

Figure 4B:
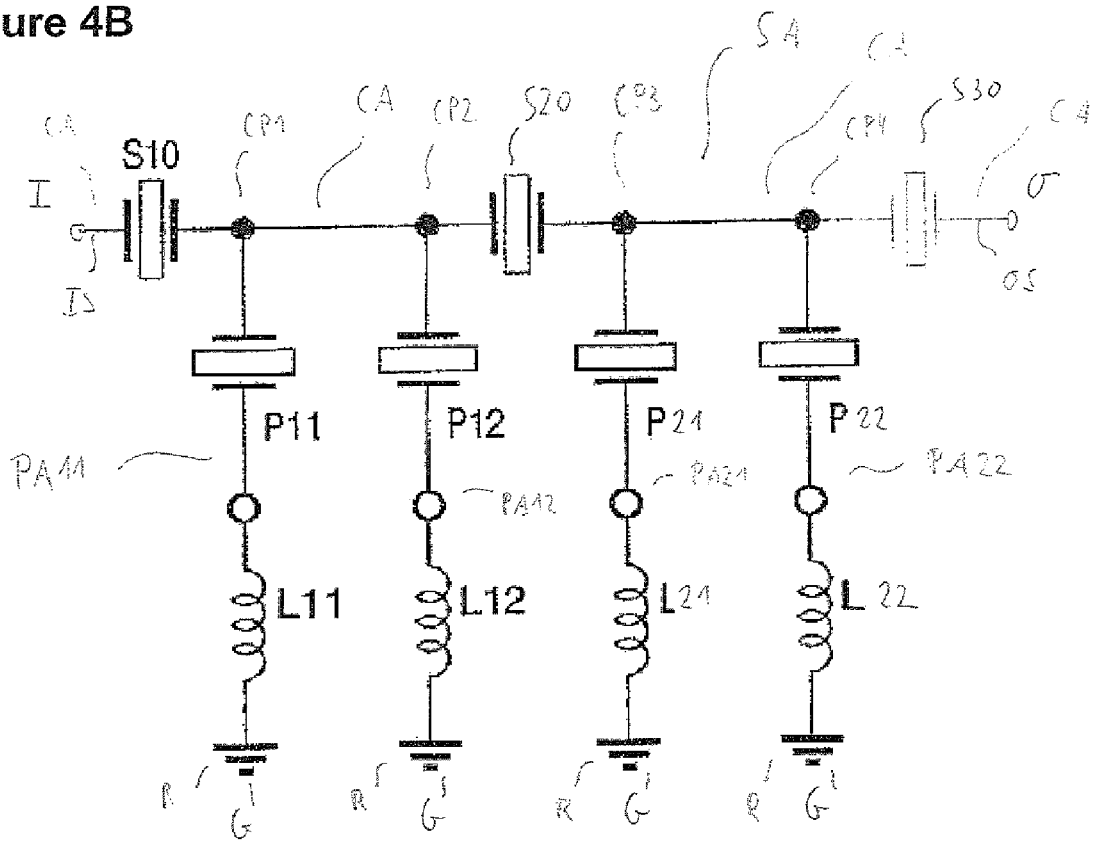
FIG. 4B shows an embodiment of a bulk acoustic wave filter having two pairs of split parallel arm resonators coupled in series with inductivities.

FIG. 4B shows an embodiment of a BAW filter in which the parallel arm PA20 is split in parallel arms PA21 and PA22. That means the parallel arm resonator P20 of FIG. 4A is split in the parallel arm resonators P21 and P22 which have together, in terms of sum of their areas, the same size as parallel arm resonator P20. Parallel arm resonator P21 is individually coupled in series with inductivity L21 so that the series connection of parallel arm resonator P21 and inductivity L21 is connected between a connection point CP3 of series arm SA and the reference terminal R to apply the ground potential G. Parallel arm resonator P22 is individually connected in series with inductivity L22 so that the series connection of parallel arm resonator P22 and inductivity L22 is connected between a connection point CP4 of series arm SA and the reference potential G. Connection points CP3 and CP4 may be formed as bump contacts which are connected to a common series arm section CA between series arm resonators S20 and S30. Each of the parallel arms enables to generate a pair of poles in the curve of the transmission parameter S21.

Figure 4C:
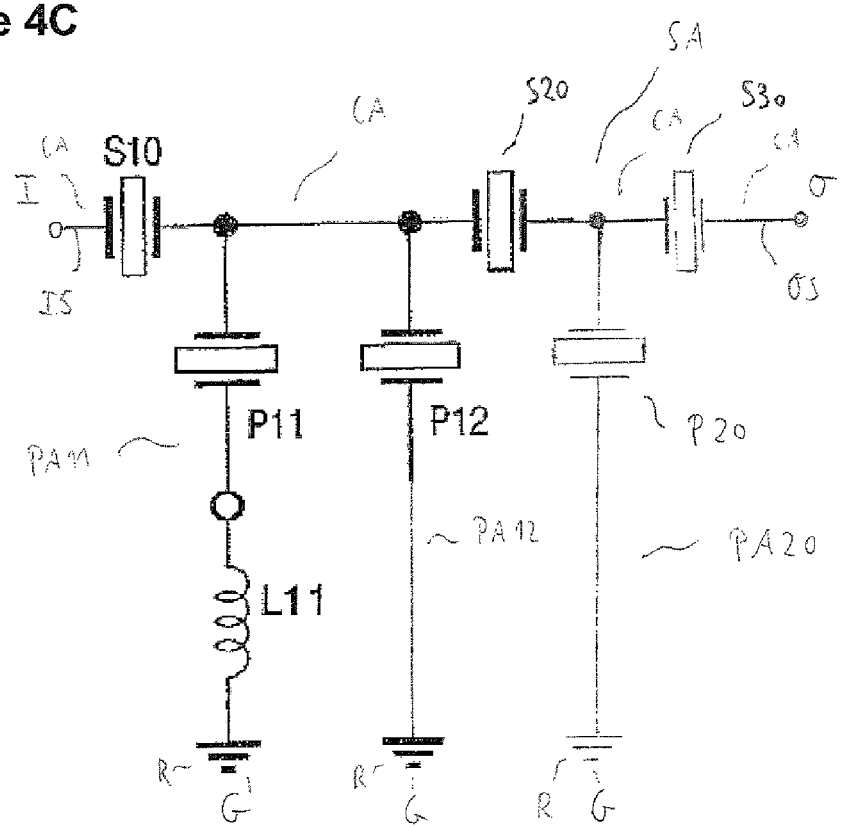
FIG. 4C shows an embodiment of a bulk acoustic wave filter having split parallel arm resonators coupled to a reference potential in a different way.

FIG. 4C shows another embodiment of a BAW filter of ladder-type structure comprising the parallel arm PA11 and the parallel arm PA12. Parallel arm PA11 comprises the series connection of parallel arm resonator P11 and inductivity L11. In contrast to the embodiment of the BAW filter shown in FIG. 4A parallel arm resonator P12 is connected to the reference terminal R to apply the reference potential G such as the ground potential without interconnecting an inductivity. Rather, parallel arm resonator P12 is directly connected to the reference terminal R.

The embodiment of FIG. 4C does not cause to the generation of two different poles of a pair of poles since the pole P6 at the frequency $f^{P12}_{r,low}$ is located in the left notch of the filter curve and the pole P5 at the frequency $f^{P12}_{r,high}$ is located at very high frequencies outside the frequency range of mobile communication. However, the embodiment shown in FIG. 4C allows to generate a left notch of the filter transfer curve S21 which is deeper than the left notch of the filter transfer curve according to the embodiment shown in FIG. 4A. Thus, the filter of FIG. 4C has a steeper left edge.

Figure 5:
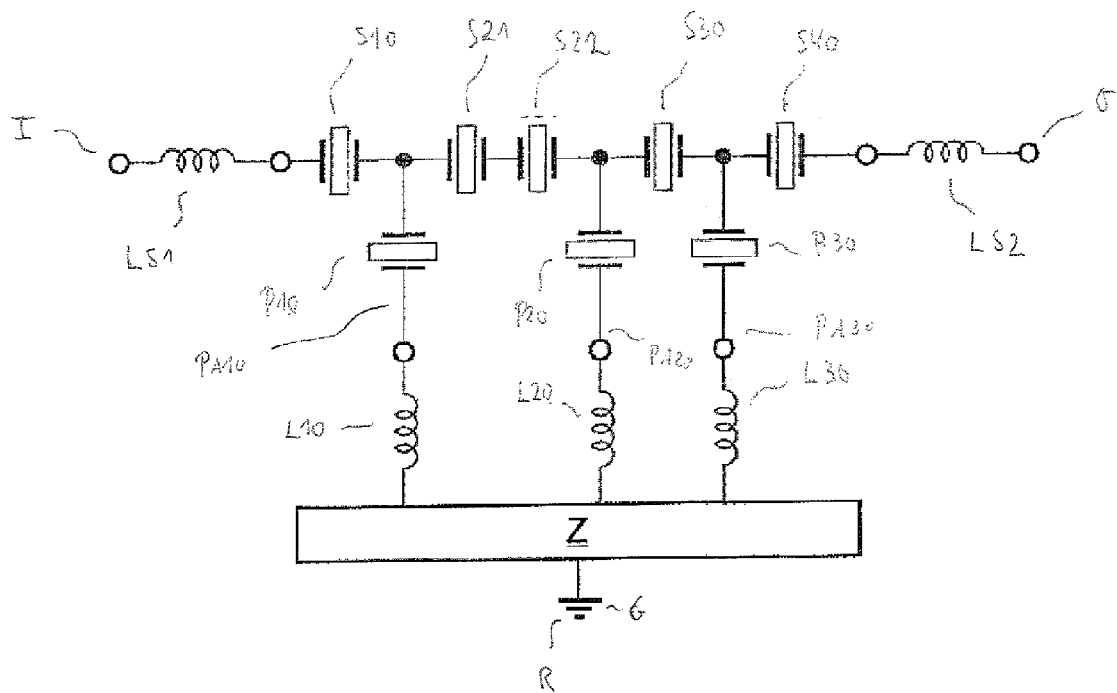
FIG. 5 shows an embodiment of a bulk acoustic wave filter having parallel arm resonators coupled to a reference potential by a network.

FIG. 5 shows an embodiment of a BAW filter in a ladder-type structure comprising a series arm SA having the input terminal I and the output terminal O which are connected by inductivities LS1 and LS2 to a series connection of series arm resonators S10, S21, S22, S30 and S40. According to the embodiment shown in FIG. 5 a series arm resonator S20 is split into the serially coupled series arm resonators S21 and S22. The embodiment of the BAW filter comprises parallel arms PA10, PA20 and PA30. Parallel arm PA10 comprises the series connection of parallel arm resonator P10 and inductivity L10. Parallel arm PA20 has the series connection of parallel arm resonator P20 and inductivity L20. Parallel arm PA30 comprises parallel arm resonator P30 and inductivity L30 coupled in series. All of the parallel arms are coupled to a reference terminal R of the reference potential G such as a ground potential via a passive network Z.

One of the inductivities L10, L20 and L30 is typically very small so that the left edge of the pass band is steep and the left notch of the filter is sufficiently deep to achieve a sufficient suppression in the stop band below the pass band. The filter design enables the generation of two pairs of poles which are appropriate to provide a suppression in the stop band above the pass band. One of these poles is used for the suppression in the frequency band of the other one of an RX/TX filter of an antenna duplexer so that only one pole remains to enable the suppression of the high frequencies.

Figure 6:
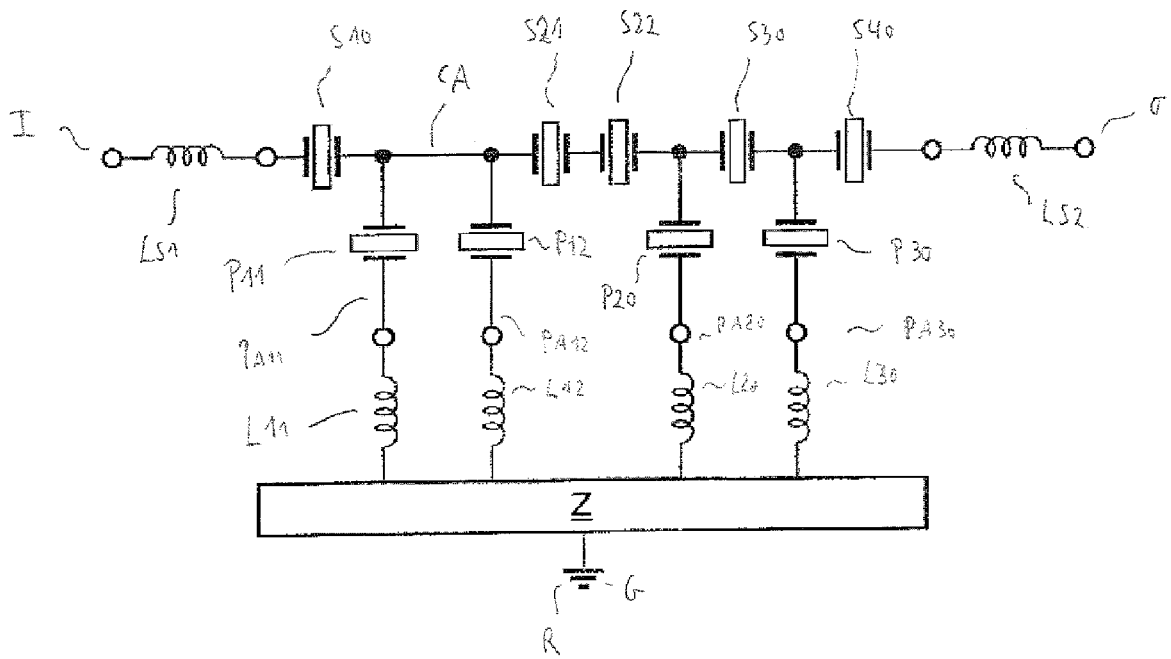
FIG. 6 shows another embodiment of a bulk acoustic wave filter having parallel arm resonators coupled to a reference potential via a network.

FIG. 6 shows a further embodiment of a BAW filter which may be used in an antenna duplexer. In contrast to the embodiment shown in FIG. 5 the parallel arm PA10 is split in the parallel arms PA11 and PA12. The parallel arm resonator P10 of FIG. 5 is split in the two parallel arm resonators P11 and P12 having the same size of area as parallel resonator P10. Parallel arm resonator P11 is individually connected in series with inductivity L11 in the parallel arm PA11. Parallel arm resonator P12 is connected in series with inductivity L12.

All of the parallel arms PA11, PA12, PA20 and PA30 are connected to a reference terminal R to apply a reference potential, such as the ground potential G, via a passive network Z. The passive network Z may comprise passive elements such as inductivities and capacities wherein the detailed structure of the passive network Z depends on the application in which the filter is used. In comparison to the embodiment shown in FIG. 5 the splitting of the parallel arm resonator P10 in the two parallel arm resonators P11 and P12 results in the existence of an additional pair of poles in the transmission curve of parameter S21.

Figure 7:
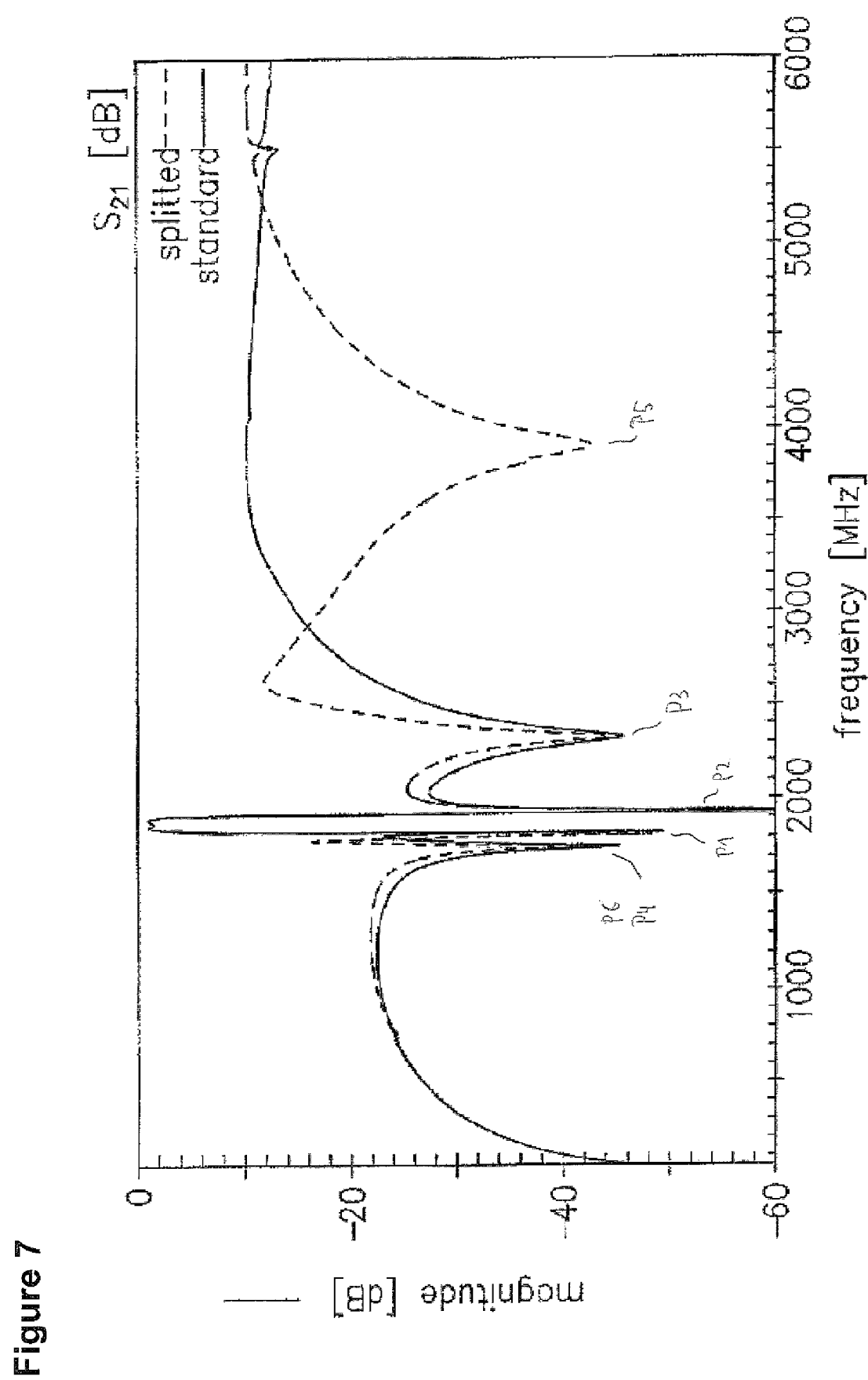
FIG. 7 shows a transfer function of a transmission parameter of an embodiment of a bulk acoustic wave filter.

FIG. 7 shows a course of the transmission parameter S21 of the embodiment of the BAW filters shown in FIG. 5 (standard filter) and the embodiment of the BAW filter shown in FIG. 6 (split filter design). The embodiment of the BAW filter shown in FIG. 5 enables to generate a pole P3 above the pass band and a pole P4 below the pass band. The filter design shown in FIG. 6 having the split resonators P11 and P12 allows to generate additional poles P5 and P6. The pole P5 and P6 are generated by the parallel arm PA12. In the example shown in FIG. 7 the parallel arm resonator P12 and the inductivity L12 are designed so that the pole P5 is generated in the stop band above the pole P3 and the other pole P6 is nearly identical with the pole P4. The poles above the pass band are located in a relative high distance to each other, whereas the poles in the stop band below the pass band nearly collapse.

What is claimed is:

1. A bulk acoustic wave filter of ladder-type structure, comprising:
   an input terminal to carry an input signal into the filter;
   an output terminal to carry an output signal out of the filter;
   a reference terminal to carry a reference potential;
   a series arm coupled between the input terminal and the output terminal;

at least one series arm resonator disposed in the series arm, such that the series arm is distributed in series arm sections between the input terminal and the output terminal by the at least one series arm resonator;

a first parallel arm comprising a parallel arm resonator and an inductivity, the parallel arm resonator and the inductivity of the first parallel arm coupled in series between the series arm and the reference terminal; and at least one second parallel arm comprising a parallel arm resonator, the first parallel arm and the at least one second parallel arm being coupled in parallel between a common one of the series arm sections and the reference terminal;

wherein a transmission parameter of the filter specifying a relationship between the input signal and the output signal of the filter has a first pole and a second pole, an insertion loss of the filter being lower in a frequency range between the first and second pole than in a frequency range below the first pole and above the second pole; and wherein the parallel arm resonator and the inductivity of the first parallel arm are arranged so that the transmission parameter of the filter has a third pole and a fourth pole, one of the third pole or the fourth pole being disposed above the first pole and the second pole and the other one of the third and fourth poles being disposed below the first pole and the second pole.

2. The bulk acoustic wave filter as claimed in claim 1, wherein the at least one second parallel arm comprises an inductivity coupled in series with the parallel arm resonator between the common one of the series arm sections and the reference terminal.

3. The bulk acoustic wave filter as claimed in claim 1, wherein the at least one series arm resonator comprises:

a first series arm resonator and a second series arm resonator coupled in series between the input terminal and the output terminal.

4. The bulk acoustic wave filter as claimed in claim 3, wherein the common one of the series arm sections is disposed between the first series arm resonator and the second series arm resonator.

5. The bulk acoustic wave filter as claimed in claim 3,
wherein the first series arm resonator is coupled to the input terminal, and
wherein the common one of the series arm sections is disposed between the input terminal and the first series arm resonator.

6. The bulk acoustic wave filter as claimed in claim 3,
wherein the second series arm resonator is coupled to the output terminal,
wherein the common one of the series arm sections is disposed between the output terminal and the second series arm resonator.

7. The bulk acoustic wave filter as claimed in claim 1,
wherein the first parallel arm is coupled to the series arm at a first connection point,
wherein the at least one second parallel arm is coupled to the series arm at a second connection point, and
wherein the first connection point and the second connection point are spaced apart from each other.

8. The bulk acoustic wave filter as claimed in claim 7, wherein the first connection point and the second connection point are held at the same electrical potential.

9. The bulk acoustic wave filter as claimed in claim 7, wherein the first connection point and the second connection point of the series arm are spaced apart from each other by a distance along the common one of the series arm sections.

10. The bulk acoustic wave filter as claimed in claim 1, wherein the parallel arm resonator of the first parallel arm and the parallel arm resonator of the at least one second parallel arm have the same size.

11. The bulk acoustic wave filter as claimed in claim 1, wherein the parallel arm resonator of the first parallel arm and the parallel arm resonator of the at least one second parallel arm have different sizes.

12. The bulk acoustic wave filter as claimed in claim 1, wherein the first parallel arm and the at least one second parallel arm are coupled to the reference terminal via a passive electrical network.

13. The bulk acoustic wave filter as claimed in claim 1, wherein the parallel arm resonator and an inductivity of the at least one second parallel arm are arranged so that the transmission parameter of the filter has a fifth pole and a sixth pole, one of the fifth pole or sixth pole being disposed above the first pole and the second pole and the other one of the fifth pole and the sixth pole being disposed below the first pole and the second pole.

14. The bulk acoustic wave filter as claimed in claim 1, wherein the reference potential comprises a ground potential.

15. The bulk acoustic wave filter as claimed in claim 1, wherein each of the at least one series arm resonator and the parallel arm resonators comprises a bulk acoustic wave resonator.

\* \* \* \* \*